United States Patent [19]

Miller

[11] Patent Number: 5,051,219
[45] Date of Patent: Sep. 24, 1991

[54] AUTOMATIC HANDLING OF GREEN CERAMIC TAPES

[75] Inventor: James A. Miller, Apollo, Pa.

[73] Assignee: Aluminum Company of America, Pittsburgh, Pa.

[21] Appl. No.: 383,647

[22] Filed: Jul. 24, 1989

[51] Int. Cl.⁵ .......................... B28B 11/16; B29D 7/00
[52] U.S. Cl. .................... 264/40.7; 264/145; 264/153; 264/171; 264/212; 83/55
[58] Field of Search ............... 264/40.1, 153, 67, 145, 264/37, 171, 212, 40.7; 83/49, 50, 55, 103, 409, 255, 209, 97

[56] References Cited

U.S. PATENT DOCUMENTS

| | | | |
|---|---|---|---|
| 3,904,473 | 9/1975 | Warner et al. | 156/470 |
| 4,353,958 | 10/1982 | Kita et al. | 428/329 |
| 4,467,969 | 8/1984 | Godfrey et al. | 264/37 |
| 4,752,857 | 6/1988 | Khoury et al. | 361/321 |
| 4,786,342 | 11/1988 | Zellner et al. | 264/58 |

Primary Examiner—James Lowe
Assistant Examiner—Christopher A. Fiorilla
Attorney, Agent, or Firm—Elroy Strickland

[57] ABSTRACT

Method for making blanks from a fragile, flexible material cast on a supporting strip and rolled to form a composite roll of the flexible material and strip. The method includes the process of separating the supporting strip from the flexible material, winding the supporting strip on a take-up roll and cleaning the flexible material before it reaches a station for blanking cards from the flexible material. The cards blanked from material are collected on a conveyor, while a remaining skeleton of the flexible material is collected for reuse in making the flexible material.

6 Claims, 1 Drawing Sheet

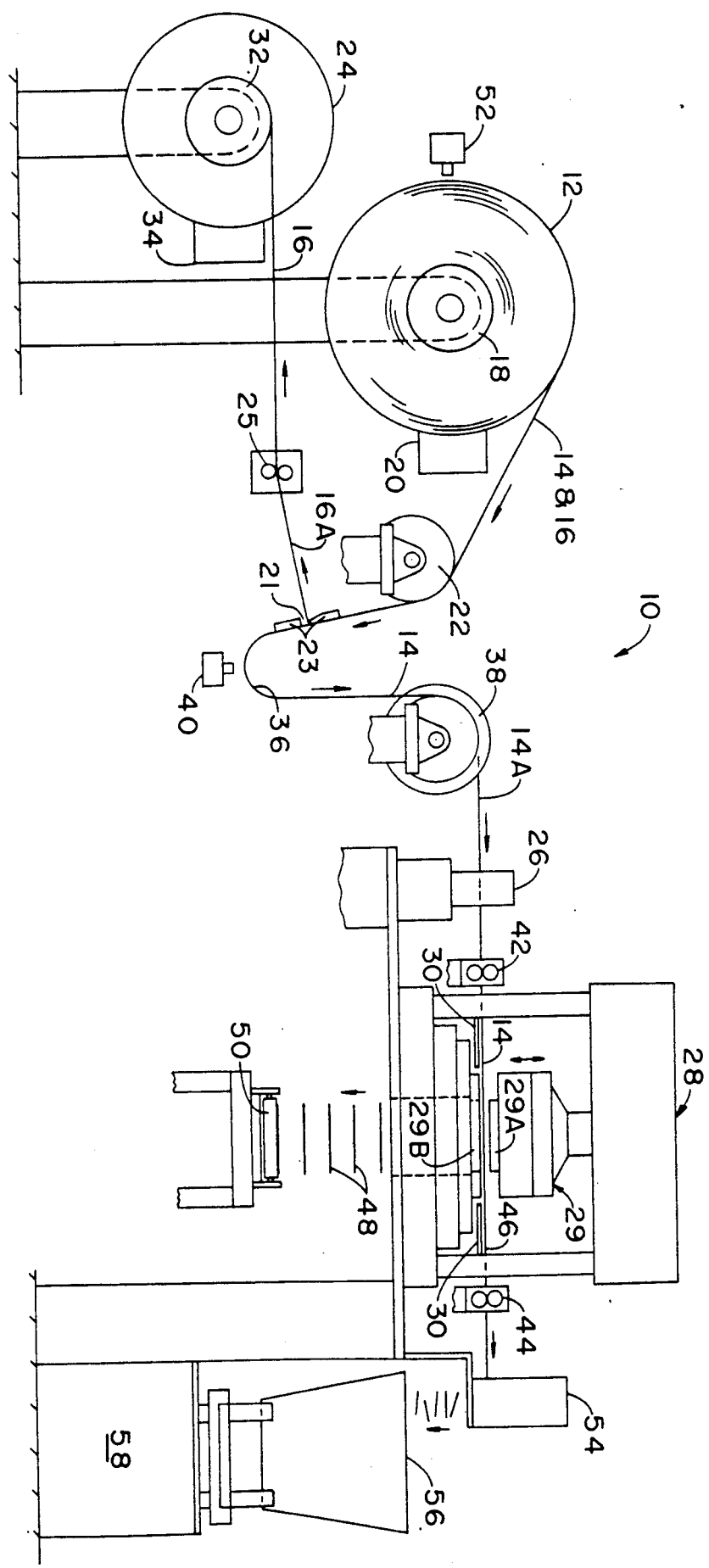

AUTOMATIC HANDLING OF GREEN CERAMIC TAPES

The present invention is directed to the handling of flexible, fragile (tearable), material more particularly, the present invention is relative to the handling of green ceramic tape employed in the manufacture of pin grid array assemblies and substrates for packaging integrated circuit chips.

Packaging modules containing pin grid array interconnect devices for the computer industry are made from what is generally known as "green" ceramic cards. The term "green" refers to unfired ceramic bodies. The cards are cut from a flexible, fragile green ceramic tape. The tape is cast from a slurry or slip of material contained in a hopper. The slip material is a mixture of ceramic powders, organic binders and solvents. In forming the tape, a wet film of the slip is cast on a supporting strip by a method that is known in the art as doctor blading. The wet film is dried on the supporting strip to form the green tape before the ceramic material is subject to further handling.

Heretofore, the green tape was manually handled in the process of separating the supporting strip from the tape and, cutting the cards from the tape. This required a substantial number of people, as the tape was manually slit and cut with knives to form the cards, or manually supplied to shuttles or other conveying devices for feeding a blanking press to make the cards. After blanking the cards were manually stacked for further processing in the overall manufacture of packaging modules.

Because the production process was essentially manual, production losses and costs were high. This was due to the fact that the material of the green tape and blanks is fragile, as it is easily broken and torn. In addition, the tape is abrasive, requiring personnel to wear gloves to protect their hands. Gloves are needed also to maintain the tape free of finger prints.

Lastly but not the least in importance, the market demand for integrated chips and their supporting substrates is substantial to the point that manual handling of the green ceramic tape and cards is simply too slow.

SUMMARY OF THE INVENTION

The present invention is directed to eliminating manual handling of the green ceramic tape and to increasing the production of green ceramic cards by the use of apparatus that permits automated handling and blanking of the tape, as well as automatic recovery of the remaining green ceramic scrap and the strip of material upon which the ceramic tape is originally cast.

The invention solves the problems of manual handling and high manufacturing costs by initially casting the green ceramic tape onto a strong, recoverable and reusable strip of supporting material, such as Mylar, a polyester made by the condensation of a therephtahlic acid and ethylene glycol, and then rolling the combination into large rolls after the tape has dried. Such a large composite roll can now be automatically payed-off into a blanking press after the roll is mounted on a pay-off spindle or mandrel located adjacent the press.

The apparatus of the invention includes the pay-off mandrel and a mandrel for receiving an empty spool to collect the supporting strip. The supporting strip is separated from the green ceramic tape before it is fed to a blanking die. Before the tape reaches the blanking die, it is cleaned by a cleaning device located in the path of travel of the tape.

The blanking die blanks individual cards from the green ceramic tape, which cards are collected on a conveyor located beneath the die. The conveyor transfers the cards to a further work station. The present apparatus, therefore, is a first apparatus in a series of stations and apparatus for automatically handling green ceramic cards in the overall process of making pin grid array packages.

After the blanking operation, a skeleton of green ceramic tape remains. This skeleton is placed in a chopping device located at the exit side of the blanking die and is automatically cut into small pieces. From the chopping device the ceramic scrap is collected in a container ("tote") device for discard or reuse in making the ceramic mixture from which the green tape is cast.

All of the above operations are done automatically, except for initial separation of the supporting strip from the ceramic tape and initial threading of the tape for blanking. Only one person is needed to do this and to operate the apparatus.

THE DRAWING

The objectives and the advantages of the present invention will be better understood from consideration of the following detailed description and the accompanying drawing, the sole figure of which is a side elevation view of the apparatus of the invention.

PREFERRED EMBODIMENTS

Referring now to the figure of the drawing, an apparatus 10 is shown in the side elevation for automatic, non-manual handling of a large, flanged roll 12 of green ceramic tape 14 cast on a supporting strip 16 of reuseable material. Roll 12 is thus a roll comprised of two materials, namely, the green tape and the supporting strip. A typical size of roll 12 is twenty four inches in diameter, nine and a half inches wide and weighs about 150 pounds.

Roll 12 is shown in the figure located on a spindle 18 drivable by a motor 20. Motor 20 is only partially visible in the figure. Preferably, the motor drives spindle 18 through a series of reductions (speed reducing gears), all of which are located in horizontal alignment with the axis of and behind spool 12. One end of the motor is visible, as the motor is located at a right angle to the axes of the reduction gears, spindle and spool. The motor drives the reducing gears through a right angle coupling.

To prepare apparatus 10 for the blanking operation, an operator initially energizes motor 20 to unwind a portion of composite strip 14 and 16 from roll 12 to provide a supply of the same for an idler roller 22 and for separating strip 16 from cast material 14. The supporting strip 16 is then manually separated from the green ceramic tape and directed through a slot 21 in plate means 23 that serves to strip 16 from 14. The surfaces of the plate are smooth so as not to harm the strip and tape in passing over and through the plate. From the stripper plate, strip 16 can be taped to the trailing end of a preceding strip 16A remaining on an otherwise empty flanged spool 24, where strip 16 will be collected during the blanking process described hereinafter. Strip 16 may also be suitably manually attached to the central core of empty spool 24. In either case, strip 16 passes between a set of constant torque rolls 25. The strip is collected for reuse as a supporting strip in future castings of green ceramic tape.

Similarly, the green tape can be manually attached (taped) to the trailing end of preceding green tape 14A and threaded through a cleaning device 26 and into a blanking press 28. The cleaning device is preferably of the type that can be opened to allow positioning of the tape therein, and the press has opposed shelves 30 that support the tape for the blanking operation. (Press 28 includes an upper portion 29 housing a ram (not shown) for driving a male die 29A into a female die 29B for the blanking operation discussed hereinafter.)

Roller set 25 serves, inter alia, to provide tension for removing strip 16 from tape 14 in pulling the strip from plate 23 and directing the strip to roll 24 during the blanking process. To this end, the roller set is driven by a constant torque motor (not shown). The roller set also functions to isolate the above strip-tape separating procedure from the output of a torque motor 34, discussed in detail hereinafter.

Spool 24 is located on a mandrel or spindle 32 that is driven by a suitable constant torque motor 34, only partially visible in the figure. Like spindle 18, spindle 32 is driven through a series of reductions that provide a suitable range of RPMs for collecting strip 16. Motors 20 and 34 are preferably computer controlled in a manner described in detail hereinafter.

The green ceramic tape 14 has sufficient integrity, after it is cast on strip 16 and allowed to dry, to support itself after it is separated from supporting strip 16 in a slack or half loop position 36 between roll 22 and an adjacent roll 38. Slack in the tape is necessary, as the blanking operation requires an intermittent "pulsed" supply of tape, while the pay-off of the tape from spool 12 is continuous.

The size of loop 36 is controlled by a proximity sensor 40 (only diagrammatically depicted in the figure). Sensor 40 outputs a signal to the above computer that represents the proper size of the loop so that computer can order changes in the speed of motor 20 that drives spindle 18. Such a sensor can be, for example, an optical device comprised of a light source and detector, the source directing light energy to and the detector receiving light energy from the lower surface of the loop.

From loop 36, the tape is forwarded (pulled, as explained below) to cleaning device 26 over an idler roll 38. The cleaning device is preferably one that removes static electricity, then brushes the upper and lower surfaces of tape 14, as it passes through the device and vacuum cleans the brushed surfaces so that the tape is presented to blanking press 28 in a thoroughly clean condition.

In the blanking process the tape is pulled in a "pulsed" manner from the supply of loop 36 by motor driven roll set 42, located between cleaning device 26 and blanking press 28, and fed to press 28. A second motor driven roll set 44, located at the exit side of press 28, assists in the feeding process by pulling tape 14 from roll 42 in pulsed synchronism with roll set 42. The roll sets also remove a remaining skeleton 46 of tape from the press.

The motors (not shown) that drive roll sets 42 and 44 hence move tape 14 into press 28, stop the movement of the tape, to allow the press to blank suitably sized cards 48 from the stopped tape, and then move the remaining skeleton 46 of tape from the press, as a supply of unblanked tape is moved into the press for the next blanking stroke. Preferably, when material is moved into the press and stopped for the blanking process, the roll sets are automatically separated to release the material and allow means (not shown) to center the material under blanking punch 29A of the press. When a card is blanked, the rolls reclose on the material to move new material into the press, and to remove the skeleton from the press. Such operation of rolls 42 and 44 is accomplished on orders from the above mentioned computer (not shown in the figure), i.e., the computer controls the operation of the roll separating means, such as air cylinders, and the motors of roll sets 42 and 44 in the manner above described.

As the cards 48 are blanked from tape 14 they fall from (through) female die 29B under force of gravity, to a conveyor 50. Conveyor 50 conveys the card to a next processing station (not shown) in the process of making packages for integrated circuit chips.

The speed of pay-off spool 12 is preferably controlled in response to the diameter of the material on the spool. To this end, a sensor 52 is located adjacent the spool to read the diameter. As the composite strip and tape are payed-off, sensor 52 detects the decreasing diameter of the composite, and forwards an output signal, representative of current diameter, to the computer. The computer notes the diameter and orders appropriate increases in the speed of motor 20 to maintain the supply of tape in loop 36 and the supply of strip 16 to spool 24. The computer controls the motors of apparatus through appropriate motor control relays.

Any type of sensor capable of measuring the amount of material wound on spool 12 is suitable for the purposes of the invention. An optical device, for example, in which a light beam is directed to the outer surface of the material from a source of the light, and then reflected back to a light sensitive detector, can be used. The detector senses the location of the material surface as the distance between the surface and detector increases and outputs a signal representative of such location.

Any changes that might occur between the pulsed supply of the tape to press 28 and the pay-off of tape from spool 12 will affect the size of loop 36. Sensor 40 cares for this by ordering an appropriate change in the speed of motor 20 via the computer.

As the composite material 14 and 16 is payed-off from spool 12, the supporting material (strip 16) is presented to spool 24 by roller set 25 and collected on the spool. As strip 16 is collected, the weight of the strip increases on the spool. This requires that the torque (rotational force) applied to spindle 32 be increased to maintain the rotational speed of spool 24. To this end, a torque sensor and generator (not shown) can be used to maintain the speed of drive motor 34 by outputting a signal to the computer that is representative of current torque. The computer, in response to the signal, orders increases in the torque of motor 34.

An appropriate torque sensor generator would be one that can measure, for example, the electrical current requirements of the field of motor 34, as it rotates spindle 32.

After cards 48 are blanked from the tape, the remaining skeleton 46 is directed to a chopping device 54 which cuts the skeleton into small pieces (not shown) of the tape material. The size of the piece is suitable for mixing in a batch of the solvents, organic binders and ceramic powders employed to make the tape, as per the earlier discussion. In this manner, the skeleton is not wasted.

The chopped material in 54 falls under force of gravity to a collection container or bin 56. The bin is removable so that it and its contents can be transported to the location at which the ceramic mixture is provided for the casting process.

A "full indicator" 58 is shown provided for weighing the bin and its contents at the location for collecting the material from chopping device 54. Indicator 58 provides a read-out of the weight of bin contents so that a workman can remove the bin before its contents become too heavy. This requires that the blanking operation be stopped until the bin is returned or a new one put in its place. To this end, indicator 58 supplies a signal to the computer when a certain weight is reached. The computer orders a cessation of operation until indicator 58 senses an empty bin in place under chopper 54. The computer can also notify personnel via suitable "alarm" means that the bin is full and should be emptied.

While the invention has been described in terms of preferred embodiments, the claims appended hereto are intended to encompass all embodiments which fall within the spirit of the invention.

What is claimed is:

1. An automated method for making blanks from a fragile, flexible material cast on a supporting strip and rolled to form a composite payoff roll of the fragile material and supporting strip comprising:

unwinding the fragile material and supporting strip from the roll thereof at a rate relative to the rate at which the fragile material is fed to a blanking station such that slack in the fragile material is maintained between said roll and blanking station, separating the supporting strip from the fragile material before it reaches the blanking station, winding the supporting strip on a take-up roll, feeding the fragile material at a controlled rate to the blanking station, sensing the rate at which the take-up roll receives the supporting strip, monitoring the slack in said fragile material, blanking cards from the fragile material at said station, the blanking step leaving a remaining skeleton of fragile material, collecting said cards, directing the skeleton material to a location for collecting said material, collecting material at said location.

2. The method of claim 1 including a the step of controlling the rate of unwind by sensing the diameter of the material on the payoff roll.

3. The method of claim 1 including chopping the skeleton material into relatively small pieces before said material is collected.

4. The method of claim 3 including weighing the chopped material at the collecting location.

5. The method of claim 1 in which the cards are conveyed from the location of the blanking station.

6. The method of claim 1 wherein the composite payoff roll is made by casting a slurry of a ceramic material onto a supporting strip and then winding the supporting strip with ceramic slurry thereon to obtain a payoff roll having multiple wraps of supporting strip and ceramic slurry and thereafter rotating said roll to unwind and sequentially pay off the supporting strip from the multiple wraps of said roll.

* * * * *